United States Patent

[11] 3,542,266

[72] Inventor Rudolf Woelfle
Gilching near Munich, Germany

[21] Appl. No. 717,690
[22] Filed April 1, 1968
[45] Patented Nov. 24, 1970
[73] Assignee Siemens Aktiengesellschaft
Berlin and Munich, Germany
a corporation of Germany
[32] Priority May 29, 1967
[33] Germany
[31] No. 110,050

[54] METHOD OF PRODUCING A PLURALITY OF SEPARATE SEMICONDUCTOR COMPONENTS FROM A SEMICONDUCTOR CRYSTAL BODY
8 Claims, 3 Drawing Figs.

[52] U.S. Cl. 225/2, 29/413, 29/583
[51] Int. Cl. B26f 3/00
[50] Field of Search 225/2, 96, 96.5, 98, 99; 29/583, 413

[56] References Cited

UNITED STATES PATENTS

| | | | |
|---|---|---|---|
| 3,092,522 | 6/1963 | Knowles et al. | 29/583X |
| 3,105,623 | 10/1963 | Hobbs | 225/103X |
| 3,364,399 | 1/1968 | Warner. | |

*Primary Examiner*—James M. Meister
*Attorneys*—Curt M. Avery, Arthur E. Wilfond, Herbert L. Lerner and Daniel J. Tick

ABSTRACT: Lines are scratched in the surface of a semiconductor crystal body opposite and spaced from the surface thereof having a p-n junction extending therealong. The lines are scratched to form grooves to a depth of approximately 5 micrometers in the surface of the crystal body and bound a plurality of separate semiconductor components. The components are mechanically separated from each other along the lines by rolling the surface having the p-n junction with a hard roller.

METHOD OF PRODUCING A PLURALITY OF SEPARATE SEMICONDUCTOR COMPONENTS FROM A SEMICONDUCTOR CRYSTAL BODY

DESCRIPTION OF THE INVENTION

My invention relates to a method of producing a plurality of separate semiconductor components. More particularly, my invention relates to a method of producing a plurality of separate semiconductor components from a semiconductor crystal body having a p-n junction extending along one surface thereof.

It is essential, in the present day technology, to provide semiconductor components such as, for example, transistors and diodes, by mass production. It is customary, in the production of semiconductor components of the planar or mesa type, for example, to produce a plurality of separate semiconductor components from a single semiconductor crystal body or wafer. This is due to the fact that each component is so small in size that it would be very difficult to handle if produced on an individual basis. The semiconductor crystal body is divided into a plurality of individual separate semiconductor components, prior to the mounting of such components upon their supporting bases. The subdivisions provided on the semiconductor body are the boundaries of the individual semiconductor components which are produced from said semiconductor body. The individual semiconductor components are provided by subdividing a surface of the single semiconductor crystal body with a plurality of lines scratched into said surface. Each semiconductor component is rectangular in form, so that the scratched lines are in the form of a rectangular matrix wherein one group of parallel lines intersects a second group of parallel lines at right angles. The individual semiconductor components are then separated from each other along the scratched lines by the application of mechanical force.

The lines scratched in the surface of the semiconductor crystal body or wafer produce grooves. These grooves, while they enable the separation of the individual semiconductor components by the application of mechanical force, also produce a damage depth of approximately 100 micrometers. The damage depth caused by the grooves formed by the scratched lines makes the semiconductor crystal body in the immediate vicinity of such damage unsuitable for further processing. Another result of the crystal damage caused by the grooves is that the completed individual semiconductor components have undesirable electrical characteristics and are therefore unsuitable for their intended use. This difficulty is especially prevalent in semiconductor components having a p-n junction extending along an entire surface thereof, wherein the operating characteristics of the p-n junction itself are also adversely affected.

The principal object of the present invention is to provide a new and improved method of producing a plurality of separate semiconductor components from a single semiconductor crystal body.

An object of the present invention is to provide a method of producing a plurality of separate semiconductor components which avoids the disadvantages inherent in the methods of the prior art.

An object of the present invention is to provide a method of producing a plurality of separate semiconductor components without causing crystal damage in the single semiconductor body from which the components are produced. An object of the present invention is to provide a method of producing a plurality of separate semiconductor components without undesirable electrical characteristics.

An object of the present invention is to provide a method of producing a plurality of separate semiconductor components without damage or detrimental effect to the p-n junction at a surface of the semiconductor crystal body from which the components are produced, and without adverse effect on the operating characteristics of said p-n junction.

Another object of the present invention is to provide a method of producing a plurality of separate semiconductor components from a single semiconductor crystal body, which method is simple, but reliable, effective and efficient in operation.

In accordance with the present invention, a method of producing a plurality of separate semiconductor components from a separate semiconductor crystal body having a p-n junction extending along one surface thereof and an opposite surface spaced from the one surface comprises scratching lines in the opposite surface of the semiconductor crystal body to form grooves therein bounding the separate semiconductor components. The components are mechanically separate from each other along the lines.

The grooves are formed to a depth of approximately 5 micrometers. The components are mechanically separated from each other by rolling the one surface of the semiconductor crystal body with a hard roller such as steel.

In order that the present invention may be readily carried into effect, it will now be described with reference to the accompanying drawing, wherein.

Figure 1:
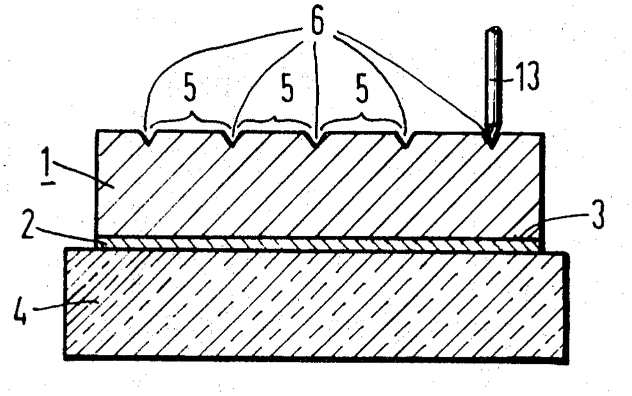
FIG. 1 is a sectional view illustrating the grooves formed in a semiconductor crystal body in accordance with the method of the present invention.

In the FIGS., a single semiconductor crystal body or wafer comprises a substrate 1 and a layer 2. The substrate 1 may comprise, for example, semiconductor material of n-conductivity type and may have a thickness of 150 to 250 micrometers. The layer 2 may comprise, for example, an epitaxial layer of p-conductivity type and may have a thickness of approximately 1 micrometer. The substrate 1 and the layer 2 form a p-n junction 3 between them.

The semiconductor crystal body may be provided, for example, by pulling a silicon monocrystalline body in the 111 direction, slicing a substrate wafer from the silicon crystal, and growing the layer 2 on top of said wafer.

The semiconductor crystal body 1, 2, 3 may be supported on a base or support 4 (FIG. 1). The support 4 may comprise any suitable material such as, for example, glass or metal frit. The semiconductor crystal body or wafer 1, 2, 3 may be held on the base 4 by suction or by a water-jet (not shown in the FIGS.) with its layer 2 abutting said base.

In accordance with the present invention, lines are scratched in the surface of the semiconductor crystal body 1, 2, 3 which is spaced from and opposite the surface having the p-n junction 3 extending therealong. The lines scratched in the surface of the semiconductor crystal body 1, 2, 3 are thus produced in the free surface of the substrate 1 of said semiconductor crystal body with the assistance of a diamond point to a depth of approximately 5 microns and at distances 5 from each other which correspond to the size of the individual semiconductor components and form grooves 6 therein. The grooves 6 bound the separate semiconductor components to be produced from the single semiconductor crystal body 1, 2, 3.

Figure 2:
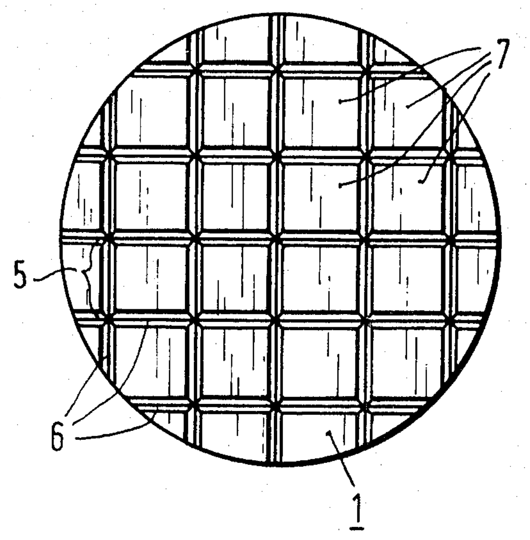
FIG. 2 is a view of the surface of the single semiconductor crystal body with the grooves formed therein in accordance with the method of the present invention.

Since each of the individual semiconductor components to be produced from the single semiconductor crystal body 1, 2, 3 is of rectangular configuration on the scratched surface of the substrate 1, the lines scratched in said are in the form of a rectangular matrix. Thus, as shown in FIG. 2, if each individual semiconductor component has a square configuration in the scratched surface, a plurality of squares 7 are formed by the grooves 6, each square having a dimension 5 of length and width. Thus, a network of chessboard pattern is provided.

Figure 3:
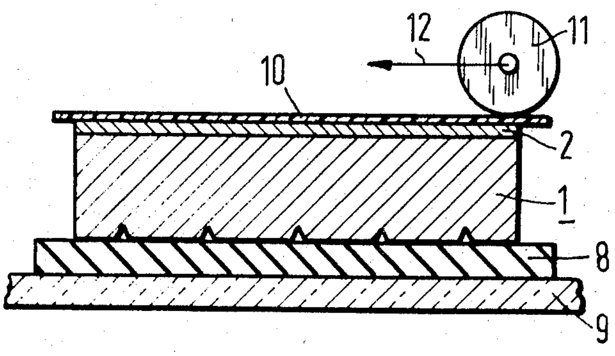
FIG. 3 is a view, partly in section, illustrating a step in the method of the present invention.

The division of the semiconductor components 7, which is recognized by the scratched lines, is accomplished, as shown in FIG. 3, by the action of mechanical forces perpendicular to the grooves 6. The semiconductor crystal body 1 is placed, with the scratched lines on the bottom and with the layer 2 on top, on a hard rubber plate 8. The hard rubber plate 8 is positioned on a planar base such as, for example, a glass plate 9, as shown in FIG. 3. The surface of the layer 2 of the semiconductor crystal body 1 is coated with a thin, but densely woven web 10 of lint-free synthetic resin fiber. The synthetic resin fiber 10 may comprise, for example, the polycondensation product of adipin acid and hexamethylene diamine. The semiconductor crystal body 1 is then broken into single components by rolling a small steel roller 11 in the direction of an arrow 12.

The lines forming the grooves 6 in the surface of the substrate 1 may be scratched with a diamond point. The grooves 6 are approximately 5 micrometers in depth and are provided by one group of parallel lines spaced by the distance 5 from each other and a second group of parallel lines spaced by the distance 5 from each other and intersecting the first group of parallel lines at right angles. The depth of the groups 6 is determined by the pressure applied to the diamond point and such pressure must be determined by the brittleness of the semiconductor crystal body 1, 2, 3.

The individual semiconductor components indicated as 7 in FIG. 2, bounded by the grooves 6, are mechanically separated from each other along the lines which form said grooves. The mechanical separation of the individual semiconductor components 7 from each other is accomplished by supporting the semiconductor crystal body 1, 2, 3 with the grooved surface of the substrate 1 thereof resting on a supporting member (not shown in the FIGS.) and with the free surface of the layer 2 of said semiconductor crystal body upward. The supporting member (not shown in the FIGS.) may comprise, for example, a hard rubber plate on a flat glass plate.

The free surface of the layer 2 of the semiconductor crystal body 1, 2, 3 is covered by a thin, dense fabric of lint-free synthetic resin fibre, such as, for example, a polycondensation product of adipin acid and hexamethylene diamine, in the aforedescribed manner. A small hard roller such as, for example, steel, is then utilized to roll the free surface of the semiconductor crystal body 1, 2, 3, thereby producing on said free surface a mechanical force perpendicular to the grooves 6 in the aforedescribed manner.

The individual semiconductor components 7 produced by the method of the invention may then be submitted immediately to the next production step. The next production step may comprise, for example, mounting on a base, in accordance with the production of a large area diode produced by epitactic precipitation.

The semiconductor components 7 produced by the method of my invention are transistors, diodes and the like. The individual semiconductor components 7, after separation from each other, are processed further by being mounted on appropriate base members (not shown in the FIGS.). The semiconductor components 7 utilized to illustrate the method of the present invention, are diodes produced by epitaxial precipitation.

It is thus seen that the method of the present invention is considerably advantageous when utilized with a semiconductor crystal body, such as the body 1, 2, 3, having a p-n junction extending along one of its surfaces. The advantage of the method of the present invention, which is the avoidance of adverse effects upon the operating characteristics of the p-n junction, is illustrated by Table I. In Table I, the resistance values, in ohm.cm are listed for 20 points of measurement on a semiconductor crystal body or wafer having a p-n junction extending along one surface thereof. Each of the measurements is obtained by the known four-point measuring method. The resultant resistance values are uniform and therefore clearly indicate the nonimpairment of the operating characteristics of the p-n junction.

TABLE I

| | | | |
|---|---|---|---|
| ------ | 0.125 | 0.122 | ------ |
| 0.118 | 0.119 | 0.117 | 0.116 |
| 0.117 | 0.116 | 0.117 | 0.119 |
| 0.118 | 0.117 | 0.117 | 0.116 |
| 0.116 | 0.118 | 0.117 | 0.113 |
| ------ | 0.116 | 0.116 | ------ |

The method of the present invention is also well suited for measuring the resistance distribution within a semiconductor wafer having an epitaxial layer or a diffusion zone.

The method of the present invention may utilize semiconductor crystal bodies or wafers of arbitrary crystal orientation, and which may comprise germanium, silicon, or semiconductor compounds.

While the invention has been described by means of a specific example and in a specific embodiment, I do not wish to be limited thereto, for obvious modifications will occur to those skilled in the art without departing from the spirit and scope of the invention.

I claim:

1. A method of producing a plurality of separate semiconductor components from a semiconductor crystal body having a front surface, a p-n junction extending for its full dimensions in the vicinity of said front surface and an opposite rear surface spaced from said front surface, said method comprising scratching lines in the rear surface of the semiconductor crystal body to form grooves therein bounding the separatè semiconductor components; and mechanically separating the components from each other by applying force to said front surface.

2. A method as claimed in claim 1, wherein said grooves are formed to a depth of approximately 5 micrometers.

3. A method as claimed in claim 1, wherein the components are mechanically separated from each other by applying mechanical force along said lines.

4. A method as claimed in claim 1, wherein the components are mechanically separated from each other by applying mechanical force to said one surface of said semiconductor crystal body.

5. A method as claimed in claim 1, wherein the components are mechanically separated from each other by rolling said one surface of said semiconductor crystal body with a hard roller.

6. A method as claimed in claim 1, wherein said grooves are scratched by diamond point to a depth of approximately 5 micrometers and the components are mechanically separated from each other by applying mechanical force to said one surface of said semiconductor crystal body.

7. A method as claimed in claim 1, wherein said grooves are formed by a diamond point to a depth of approximately 5 micrometers and the components are mechanically separated from each other by rolling said one surface of said semiconductor crystal body with a steel roller.

8. A method as claimed in claim 1, wherein the semiconductor components produced are transistors and diodes.